United States Patent
Dreoni

[11] Patent Number: 5,233,294
[45] Date of Patent: Aug. 3, 1993

[54] INDUCTIVE PROXIMITY SENSOR AND POSITION TRANSDUCER WITH A PASSIVE SCALE

[76] Inventor: Alessandro Dreoni, Via Ciro Menotti No. 38, 50136 Firenze, Italy

[21] Appl. No.: 693,134

[22] Filed: Apr. 29, 1991

[30] Foreign Application Priority Data

May 3, 1990 [IT] Italy ................. 9383 A/90

[51] Int. Cl.⁵ .............................................. G01B 7/14
[52] U.S. Cl. ......................... 324/207.16; 324/207.32
[58] Field of Search ..................... 324/207.13, 207.15, 324/207.16, 207.17, 207.22, 207.23, 206, 234, 236, 228, 260–262; 336/45; 340/547; 178/18–20

[56] References Cited

U.S. PATENT DOCUMENTS

| | | | |
|---|---|---|---|
| 2,905,874 | 9/1959 | Kelling | 324/207.17 X |
| 3,628,145 | 12/1971 | Kihlberg et al. | 324/207.17 X |
| 4,042,876 | 8/1977 | Visioli, Jr. | 324/207.16 |
| 4,112,365 | 9/1978 | Larson et al. | 324/207.16 X |
| 4,127,814 | 11/1978 | Rasigade et al. | 324/207.15 X |
| 4,249,630 | 2/1981 | Lougheed et al. | 324/207.16 X |
| 4,627,280 | 12/1986 | Hayashi et al. | 324/207.16 X |
| 4,648,041 | 3/1987 | Tarr | 324/228 X |
| 4,652,821 | 3/1987 | Kreft | 324/207.16 X |
| 4,678,994 | 7/1987 | Davies | 324/207.16 X |
| 4,697,144 | 9/1987 | Houbrook | 324/207.17 |
| 4,733,023 | 3/1988 | Tamaru et al. | 324/260 X |
| 4,737,709 | 4/1988 | Loftus | 324/207.15 |
| 4,812,757 | 3/1989 | Meins et al. | 324/207.17 X |
| 4,816,759 | 3/1989 | Ames et al. | 324/207.17 |

Primary Examiner—Gerard R. Strecker
Assistant Examiner—Warren S. Edmonds
Attorney, Agent, or Firm—McGlew & Tuttle

[57] ABSTRACT

A proximity sensor using the magnetic field of a single length of sensor wire. The sensor has a supply circuit for generating a magnetic field around the single sensor wire. The sensor also has a detection circuit for detecting when electrically conductive material intercepts the magnetic lines of flux of the magnetic field surrounding the single sensor wire. In a preferred embodiment the sensor wire is substantially straight and/or the detection circuit detects metal within a distance from the sensor wire approximately two or three times the main dimension of the cross section of the sensor wire. A plurality of sensor wires can be used and a passive actuator or scale can be used to intercept and alter the magnetic field surrounding the sensor wire. The scale can be formed of electrical short circuits aligned at constant steps. The sensor then detects the presence or absence or a short circuit in the magnetic field.

16 Claims, 6 Drawing Sheets

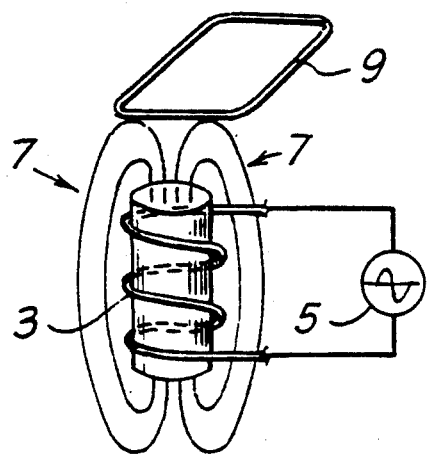
Fig. 1
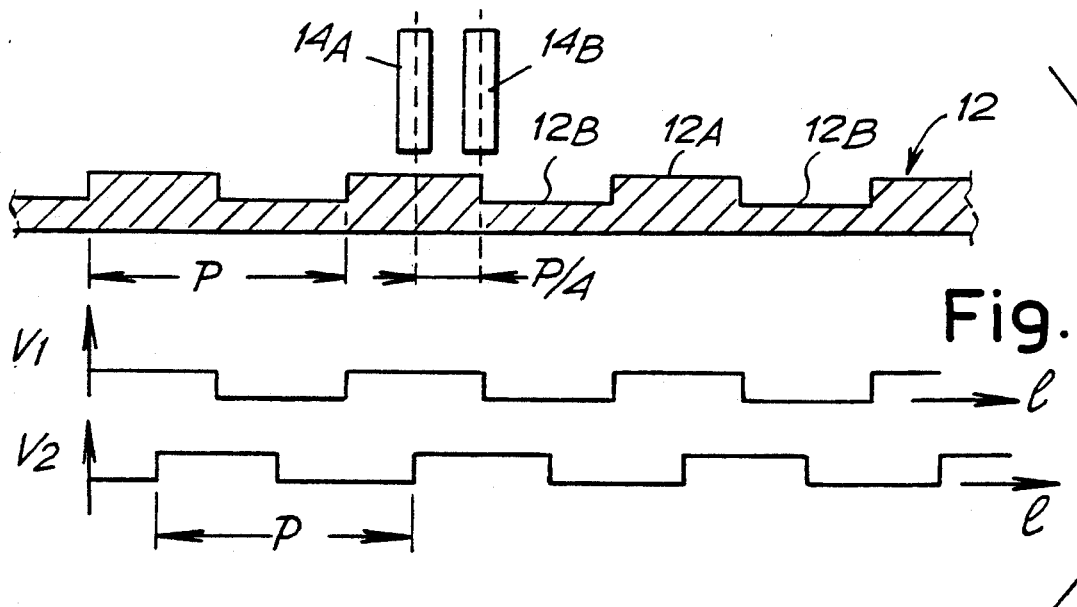
Fig. 2
Fig. 3
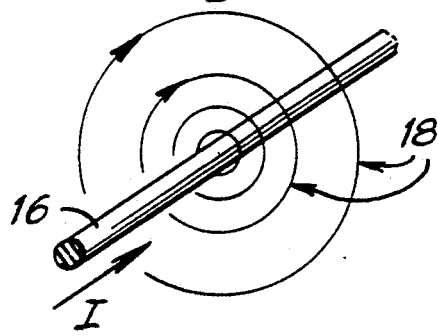
Fig. 4
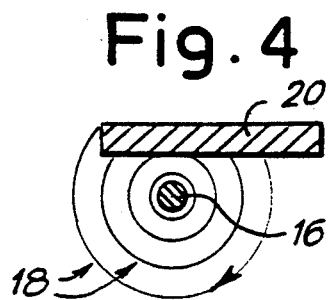

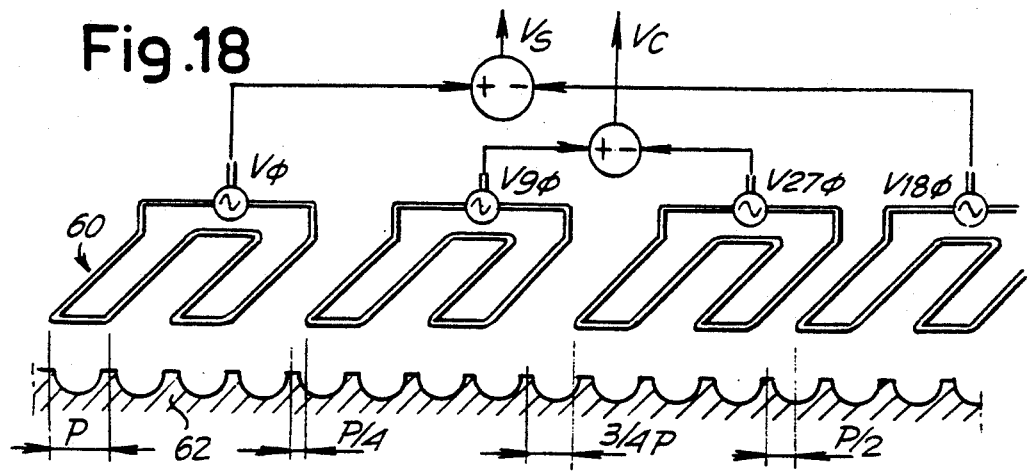
Fig.18
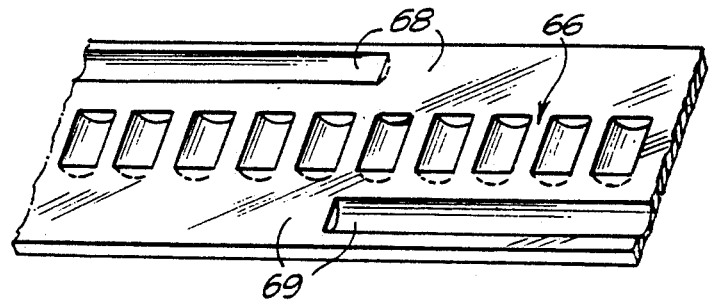
Fig.19
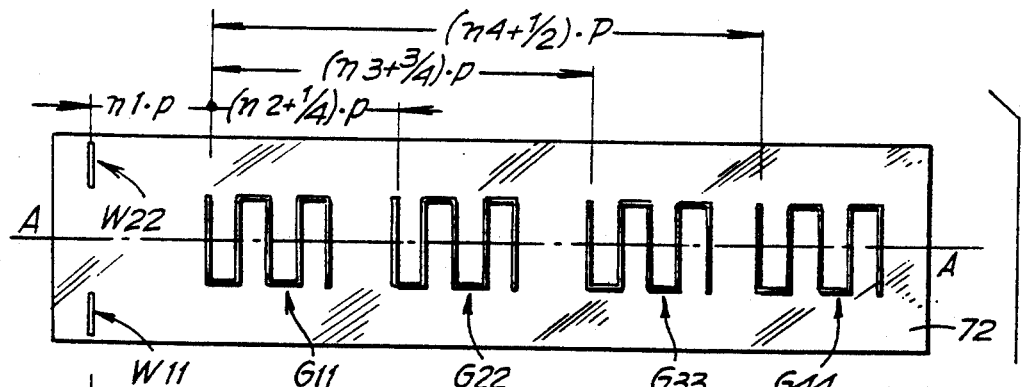
Fig.20
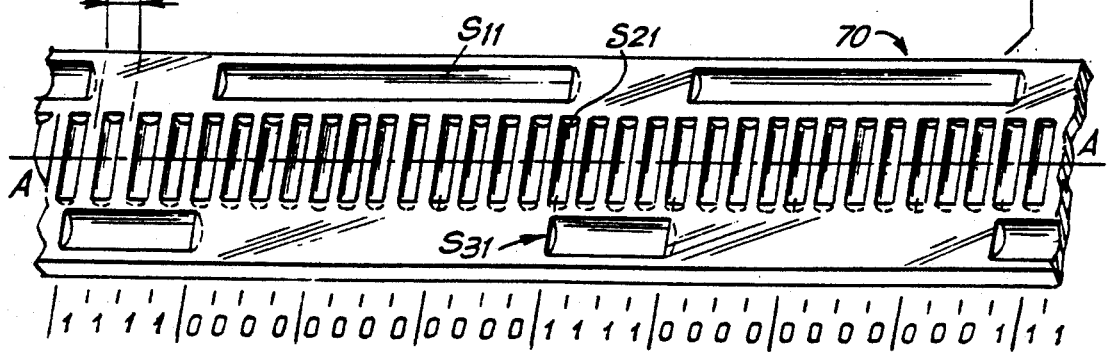

INDUCTIVE PROXIMITY SENSOR AND POSITION TRANSDUCER WITH A PASSIVE SCALE

FIELD OF INVENTION

The present invention relates in general to proximity sensors using induction, and in particular to a proximity sensor and position transducer generating a magnetic field in a single wire and detecting the presence of electrical short circuits in the generated magnetic field.

BACKGROUND OF THE INVENTION

An indispensable element in many automation systems is the precise control of movements: therefore position measurers are necessary (measuring devices or position transducers) that can be either linear or angular. Numerous types of transducers exist; those most used are:

Rotary Types

1) Resolver or synchro: these are rotating transformers with one or more primary coils supplied by alternate current and at least two secondary coils which supply a voltage, which has the same primary frequency and amplitude of primary coils. This secondary coil voltage is modulated by the variation of mutual induction. Resolvers exist in various constructive forms, including multipolar types with high precision.

2) Rotary inductosyn: it is in effect a multipolar resolver with planar development. The coils of the rotary inductosyn, reduced to just one turn, are made up of frets printed onto a circuit board 3) Rotary optical encoder, made up of a light sender, a modulated light grid reflected or transmitted versus the position, and a number of photosensitive components which generate moderated electrical current. From the photosensitive components it is possible to measure the position.

Linear Types

1) Linear inductosyn is identical to the rotary type. The only difference being that the frets are arranged in a straight line rather than on a circumference;

2) Optical bar: the principle is identical to the rotary optical encoder. The linear "scale" bears an imprinted reflecting bar at a constant step, whilst the cursor contains the light source and the references;

3) Magnetic scale: the linear "scale" is made up of a series of lines, as for the optical bar, but these are made up of small elementary magnets of alternate polarity North/South. The cursor bears the "magnetic reading heads" and the decodifying circuits.

Laser systems, which are far more precise than all the others listed, are normally applied only as reference instruments due to their high cost and the difficulty of applying them in an industrial environment.

The induction systems (resolver, synchro, inductosyn), which are amongst other things more difficult to apply because they require electrical connections to both parts in relative movements, are giving way to optical type systems, which have a good degree of precision and reasonable prices. However the insufficient reliability of an optical system is becoming more and more evident, specially in heavily automated plants, due both to dirt (oil, water dust), which makes the reflecting components opaque, and to the scarce reliability of the light generators (bulbs or LED).

SUMMARY AND OBJECTS OF THE PRESENT INVENTION

The subject of this invention is a special proximity sensor and its derivatives. Especially inductive position transducers with a passive scale, which combine the precision and simplicity of assembly of the optical systems (which have a passive scale) with the robustness and reliability of induction systems (which are not very sensitive to dirt and do not have unreliable components).

According to the invention, an inductive proximity sensor is foreseen, which comprises a single length of wire of which the magnetic field is exploited, the wire being supplied with a high frequency, an electronic supply circuit for this sensor wire, and means of detecting the greatest electrical losses and diminution of the sensor wire's inductance as a result of the proximity of metal for the detection of the metal.

Two identical sensor wires may be foreseen being arranged for differential outputs. The sensor wires face a passive actuator which has such a geometrical form as to give the presence of metal in front of one sensor wire and the absence of metal in front of the other.

Advantageously one sensor wire may be supplied with square wave voltage at a high frequency. The square waves voltage may be achieved with two uncoupled condenser switches and a signal proportional to the losses is obtained from the circuit's supply current which generates the square wave voltage, Alternatively the square wave voltage may be achieved with four switches arranged on a bridge, and the signal proportional to the losses is always obtained from the circuit's supply current which generates the square wave voltage.

A step down transformer may also be foreseen with a high ratio of turns, interposed between the supply circuit and the sensor wire. The transformer may need only one secondary turn, which may be made up of one or more conductor strips tightly wound around the primary one.

A linear or rotary measuring transducer according to another object of the invention—consisting of a scale and a cursor—may have the cursor made up of at least one sensor wire and the scale is completely passive and made up of transversal short circuits at a constant step, for intercepting a part of the magnetic flux produced. The amount of a flux intercepted is cyclically variable versus a relative position assumed during relative movements.

The scale can be developed as a series of turns in short circuit, and may include further longitudinal short circuits for dividing the turns.

Alternatively the scale may be developed as an engraved metallic mass, to form parallel and equidistant bar projections.

In an advantageous form of realization, the sensor wire is arranged in fret form with components at a constant step and equal to the scale—s step.

The transducer may include two frets placed on the cursor and out of phase by 180 mechanical degrees with respect to one step of the scale, in such a way that a sinusoidal signal is obtained from the difference of effect on these two frets. The transducer may include another two pairs of frets out of phase with each other by 90 mechanical degrees with respect to one step of the scale which is considered to be 360 degrees. In this way two signals out of phase by 90 degrees (sine and cosine) are obtained from these two pairs. The four frets may be placed in the order 0,90,270,180 degrees.

The transducer's scale may be made up of a grid with transversal and longitudinal short circuits, or obtained from solid metal bearing transversal engravings at a constant step.

To allow for zero resetting, a track if foreseen that is parallel to and synchronized with the sale. The proximity sensor will also cooperate with this or these tracks. In practice two tracks may be foreseen, one of which shows the continual presence and the other the continual absence of metal. These two tracks are inverted in correspondence with the "zero" reference. On the zero resetting tack codified engravings may be inserted which with a small shift allow for the reading of the absolute position.

Codification of information relative to the absolute position can be obtained with an unequivocal code, represented by a number of bit frames. Each frame contains an unrepeatable configuration which makes up the synchronism.

The invention will be better understood following the description and the enclosed drawings, which shows a practicable exemplification which is not restrictive of the invention itself.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 1 is a diagram of a prior art sensor;

FIG. 2 is a diagram of a position transducer of indefinite length;

FIG. 3 is a perspective diagram of the sensor wire and magnetic field;

FIG. 4 is similar to FIG. 3 with the presence of a conductor in the magnetic flux;

FIG. 18 shows a modified arrangement with sensors staggered by 90°, for more precise measurements;

FIG. 19 shows a system for resetting from zero; and

FIG. 20 shows a system wherein the absolute position of the sensor can be determined by interaction between engravings in a metal block.

DETAILED DESCRIPTION OF THE PREFERRED EMBODIMENT

Physical Principle of the Sensor

Figure 5:
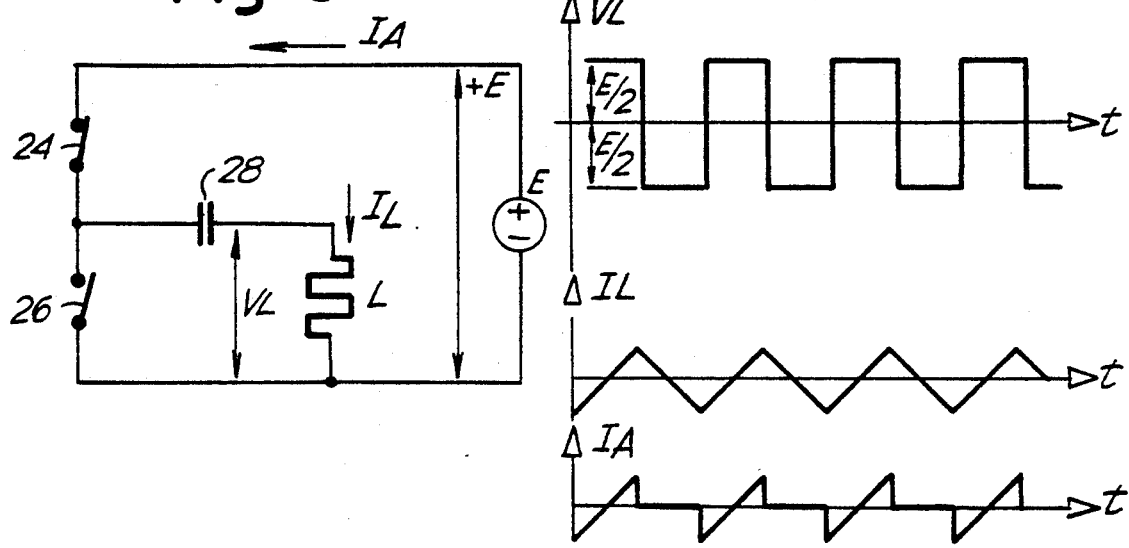
FIG. 5 and 6 are possible supply circuits with respective voltage and current graphics.

If an electric coil 3 is supplied (FIG. 1) with alternate current from a supply 5, a magnetic field 7 is obtained in the surrounding space having the same frequency as that of the supply current. The short circuit 9, immersed in this magnetic field, generates induced currents which give:

losses of power (due to Foucault or eddy currents)
a diminution of the equivalent inductance of the supply circuit including the coil 3.

This principle is largely used in inductive proximity sensors, which in various ways exploit the "reflected" variations on the supply circuit for detecting the presence or not of metal.

It is possible to construct a position transducer of any length with a system such as in FIG. 2. The scale 12, which is completely passible, and made up of a sequence of solid metal 12A and void metal 12B at a constant step p. The cursor, made up of two proximity sensors 14A and 14B arranged at a distance of a ¼ step (90 degrees), supplies two signals V1 and V2, out of phase by 90 degrees with respect to position of the scale. A bidirectional meter which receives the two signals counts the cycles and therefore supplies the position.

This system if it uses normal proximity sensor techniques, can give measurements precision at the most in the order of 0.1 mm, which is insufficient for many applications. The reason for this imprecision is the inability to "channelize" the magnetic flux produced into a fine and repeatable geometry.

If however the ferromagnetic nucleus is eliminated and the coil is reduced to a single length of wire 16 (FIG. 3) the magnetic flux lines generated 18 are strictly controlled by the geometry of the wire. Also the magnetic induction is very strong in the immediate vicinity of the wire and becomes negligible at a distance of a few diameters.

If a metal conductor 20 passes near to the wire 16 (FIG. 4) a part of the magnetic flux 18 is intercepted. Inside the metal, induced currents are generated in a short circuit that, as in normal proximity sensors, dissipate energy and diminish the sensor wire's inductance.

A practical application of this principle, which in normal conditions supplies a negligible effect, is possible with a special geometry of the sensor wire, and with an adequate electronic supply circuit.

To maximize the effect it is necessary to:
make sure that the current's passage in the sensor wire 16 is limited above all by the inductance of the wire itself (which changes in the presence of metal) more than by its own resistance (which remains fixed), and by the inductance and resistance of the supply circuit;
provide a sensitive and precise supply circuit, which allows for the measurements of the minimum variation of losses produced by the nearness of metal.

However the presence of fixed losses is always noted (both in the sensor wire and the input) which, their fluctuation being due to variations in temperature, can diminish the precision of the measurements.

To achieve the cancellation of fixed losses, two sensor wires are available, supplied by identical circuits and used in a differential manner. The passive actuator (namely the metal facing the sensor wire) must be realized in such a way that, if metal is present in front of one sensor wire, it is not present in front of the other and vice versa; the difference of the outputs of the two sensors cancels out the fixed losses and gives a precise result.

Electronic Supply Circuit.

The input frequency must be high (in the order of 1 megahertz or more) to maximize the useful inductive effect with respect to the ohmic resistance which can mask the result. High frequency is also convenient because it allows for a simpler filtering of the alternating residual due to the input and therefore a higher speed at which it is possible to make the detection.

The high frequency input of the transducer is not sinusoidal but square. A rudimentary circuit is show in FIG. 5. For a half-cycle, switch 24 is closed, and for a half-cycle, switch 27 is closed. By means of a coupling condenser 28 the square voltage value (VL) generated is applied to the load L, which can be approximately considered to be made up of inductance and resistance in series. The load current IL at a steady state is therefore made up of a succession of exponentials which give an almost triangular state. The load current flows in the input in the half-cycle in which switch 24 is closed whilst it recycles on the load itself when switch 26 is closed. If there are no losses in the switches and the equivalent load resistance is zero, the average input current IA is zero; if however there are losses, both on the switches and on the load, the average input current is no longer zero. Even without a detailed circuit analysis it is evidence from the conservation of energy principle that the input power (average current IA for direct voltage E) is the same as the sum of all the power lost.

The average input current makes up the usable signal. In the presence of metal facing the sensor wire the average input current increases both because of the greater losses directly provoked, and also because of the losses due to greater current being recalled by the diminution of inductance.

Figure 6:
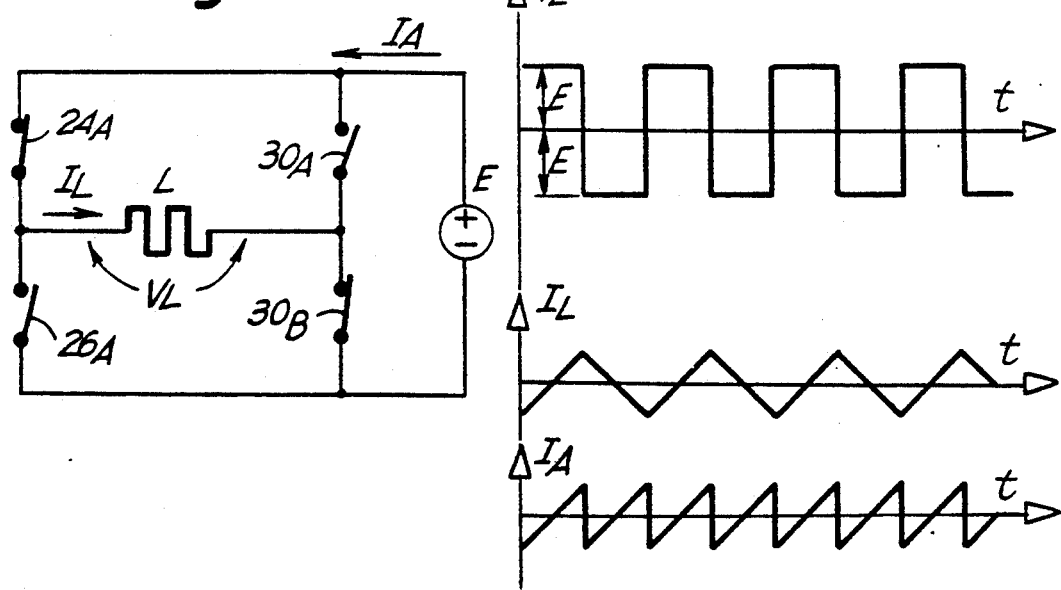

A possible variation of the supply circuit is indicated in FIG. 6: with an H shaped bridge connection the coupling condenser is eliminated. The functioning is substantially the same. Two pairs of switches 24A, 26A and 30A, 30B are symmetrically arranged with respect to the branch in which the load L is inserted.

The switches in FIG. 5 and 6 can be MOS transistors, or, even simpler, a pair of switches can be made from a section of integrated circuit in CMOS fast technology (series 74 HC.. or 74 AC.. or similar) which contains a switch in the direction of input and one in the direction of earth.

Figure 7:
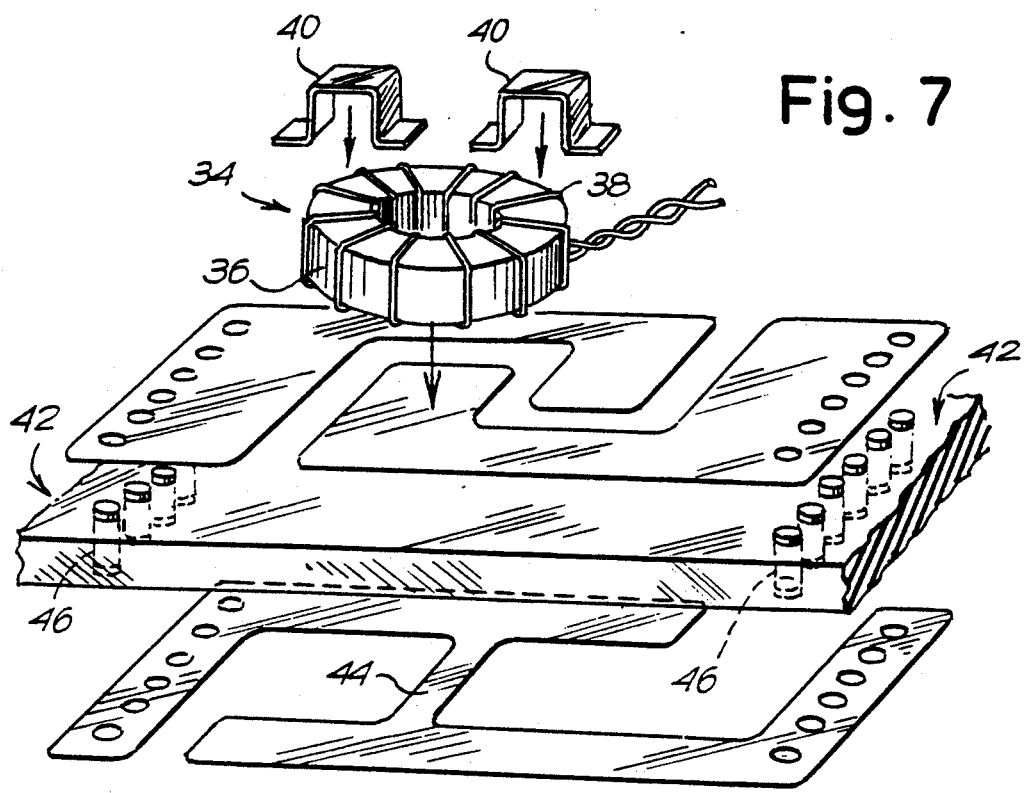
FIG. 7 is perspectively a realization diagram of the group including a step down transformer, whilst
Figure 8:
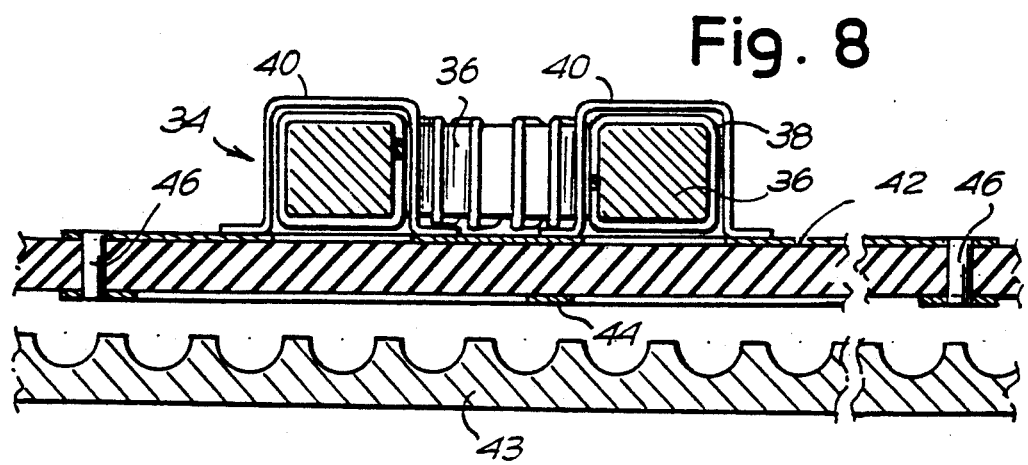
FIG. 8 is a sectional view of FIG. 7 with the scale.

It is not convenient to supply the sensor wire directly, at least with present electronic technology, because the losses on the switches become too high and rise to the point of masking losses on the load and the variation of the inductance to be measured. So a step down transformed is interposed. This also has the merit of galvanically insulating the sensor wire, which is exposed externally and therefore may produce undesirable dispersions in the direction of earth. In FIG. 7 and 8 a transformer 34 is shown made up of a ferrite toroidal nucleus 36, on which are wound the primary turns 38. The only secondary turn 40, which must present very low resistance and its own inductance, so as not to mask the useful effect, is made up of one or more copper strips exactly overlayed on the primary and soldered onto the printed circuit board 42.

A passive scale 43 is made up of solids and voids in the metallic mass.

On the same printed circuit board 42, which supports the transformer 34 and the electronic control circuit, but on the opposite face the sensor wire 44 is obtained. In order to minimize inductance and dispersed resistance of the secondary, every transformer is mounted immediately above the sensor wire 44, and connected by the metallized holes 46.

Figure 9:
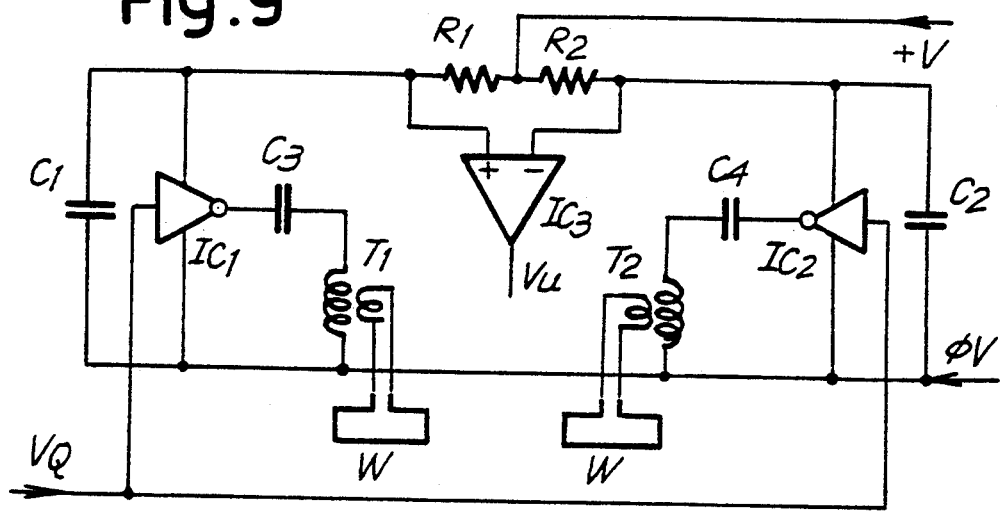
FIG. 9 is a circuit with two sensors.

Two circuits are necessary to achieve the differential effect and therefore the cancellation of the fixed losses: a resulting simplified circuit is represented in FIG. 9.

In the general circuit there are two identical sections, each one consisting of: an integrated circuit Ic1 and Ic2, which contains the switches, commanded by the square signal VQ at high frequency; a coupling condenser C3 and C4; a step down and insulating transformer T1 and T2 for the respective sensor W; filter condenser C1 and C2; a current sensor resistance R1 and R2. The integrated circuit Ic3 amplifies the difference between the two voltages representative of the current and therefore generates the direct current output signal Vu.

Cursor and Scale for Measurement System

Figure 10:
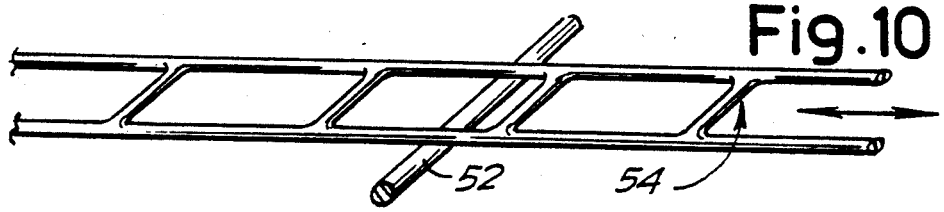
FIGS. 10, 11 and 12 show multiple turn scales of short circuits.
Figure 11:
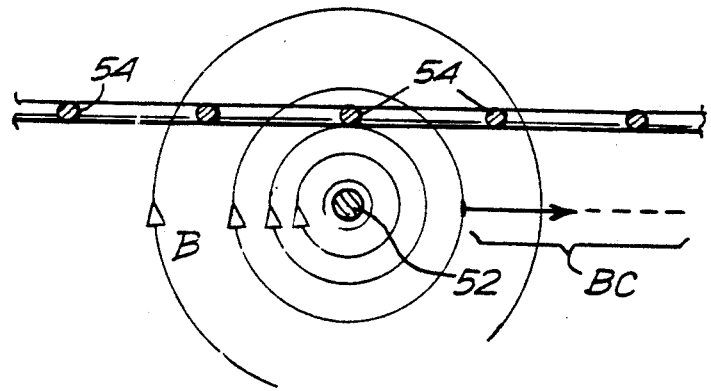
Figure 12:
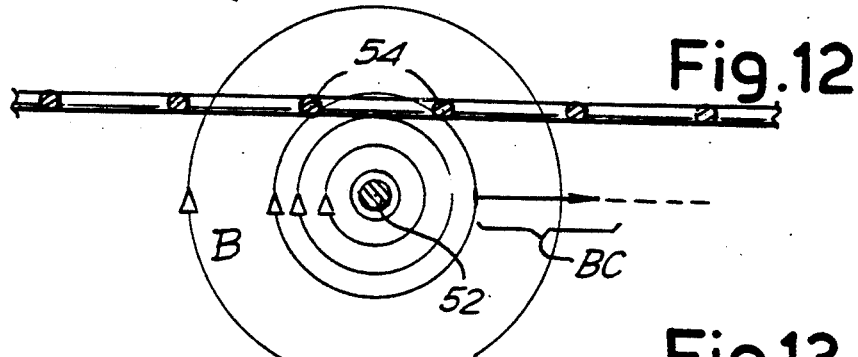

If a "scale" 54 is passed in front of the sensor wire 52 (in FIG. 10), made up of a series of turns or loops in short circuit, the short circuited flux Bc is at its maximum in the position in FIG. 11, and at its minimum in the position in FIG. 12: The losses induced from the sensor wire assume a sinusoidal state as a function of the relative working position between scale 54 and sensor wire 52.

Figure 13:
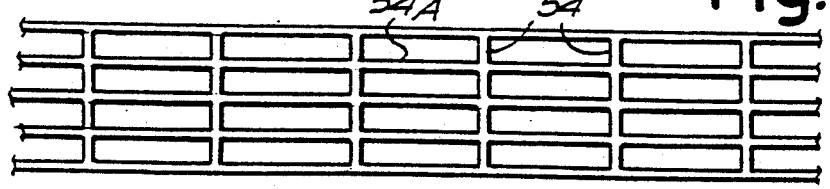
FIG. 13 is a variation with respect to FIG. 10.
Figure 14:
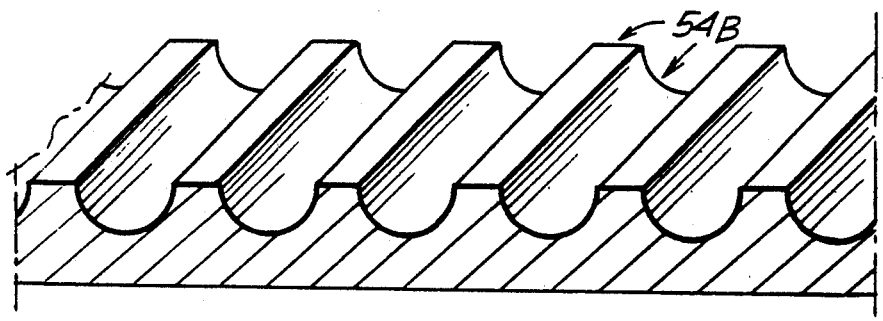
FIG. 14 shows a scale engraved on a metallic block.

Efficiency is limited by the resistance and inductance of the turn in short circuit. If the scale is made up of conductors placed on an insulator (printed circuit board type technology), it is possible to reduce the length of the turn in the short circuit by cutting it with longitudinal short circuits 54A that don't disturb the alternation solid/void. The scale then assumes the appearance of a grid as in FIG. 13. A scale engraved on the solid metal is even more efficient, as that of 43 in FIG. 8 and as indicated perspectively by 54B in FIG. 14. Moreover the solid/void relation of the scale must be opportunely chosen in such a way as to maximize the difference of the effect between the two positions of maximum and minimum connection.

Figure 15:
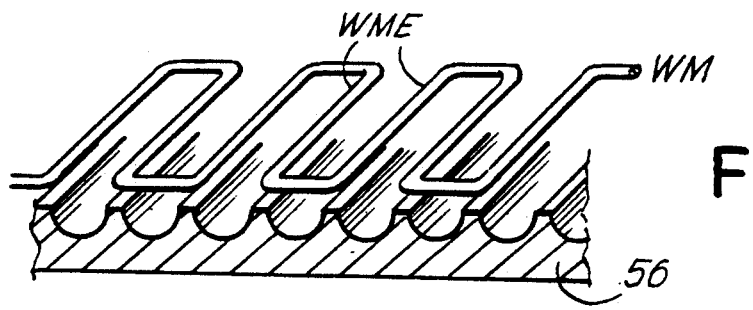
FIG. 15, 16 and 17 show executions with multiple sensors, and staggered groups.

It is also expedient to ensure that the measurement is not carried out on a single short circuit of the scale, but that it results as an average on more than one short circuit. In this way the unavoidable mechanical imprecisions locally present on the scale assume minor importance. The wire WM which makes up the cursor assumes the form of a fret (FIG. 15) with a number of transversal components WME arranged at an identical step to that of the scale such as scale 56. The resulting effect is the sum of the contribution of every single fret component WME, with the consequent diminution of the error produced by a mechanical imprecision on a single component of the scale.

Figure 16:
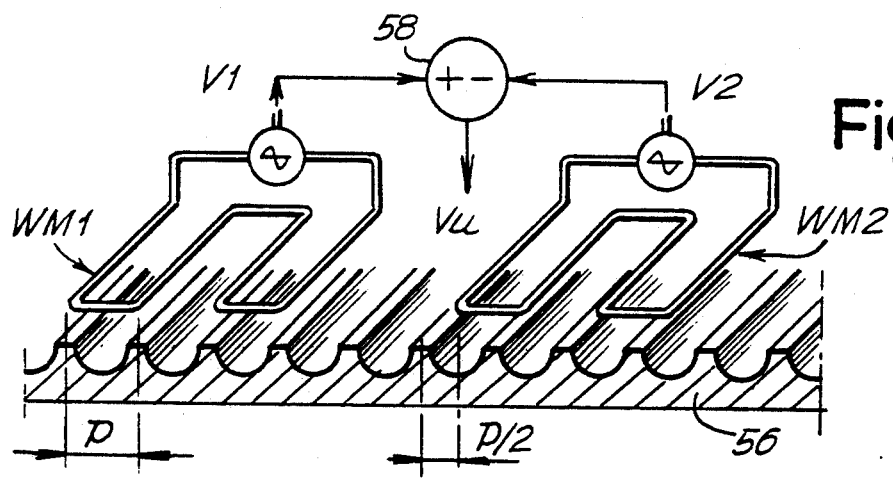
Figure 17:
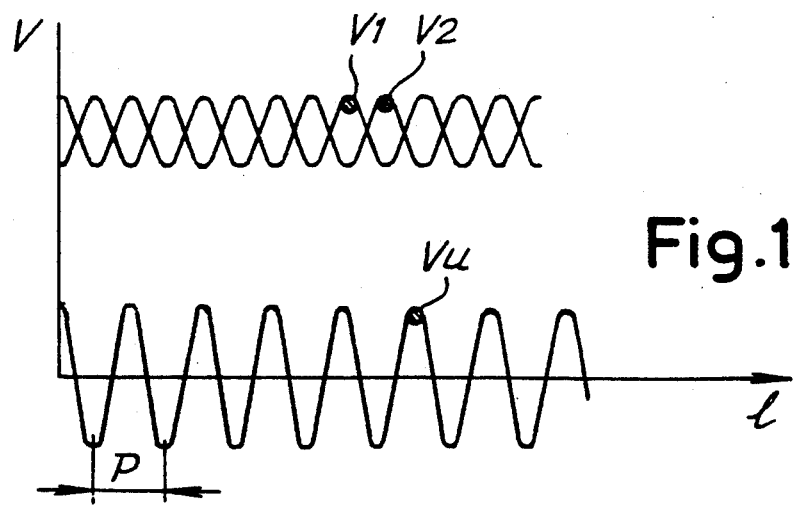

The differential effect and the cancellation of fixed losses is achieved (See FIG. 16 and 17) by arranging two frets WM1 and WM2 along the longitudinal axis of the transducer at a distance equal to a multiple of the step between the projections of scale 56 plus a ½ step. The difference of the outputs V1 and V2, supplied to an adder 58, is a sinusoid Vu with an average value of zero, well usable for the position measurement (FIG. 17).

Since for an unequivocal position measurement in the interior of a step two sinusoids are necessary (sine and cosine, 9 and 90 degrees). Another two frets are arranged (always to be used in differential) distant from the first the usual multiple of the step plus a ¼ and 2/4 of a step. As can be seen in FIG. 18, in this case the cursor 60, which contains the supply frets, includes four frets arranged on the longitudinal axis of the detector at a distance of a multiple of the step plus 1, ¼ and ½, ¾ of the step (that is 0, 180, 90, 270 mechanical degrees on 360 degrees of a step). Element 62 indicates the scale.

In considering the effects of thermal elongation every pair can be considered concentrated in the intermediate point of symmetry. To avoid measurement modulation provoked by thermal elongation, the points of symmetry of the sine couple and cosine couple should be as close together as possible. This can be achieved by arranging the frets in the order of 0, 90, 270, 180 degrees, to have in effect the coincidence of the points of symmetry.

The cursor 60 assumes the form schematized in FIG. 18. The signals supplied as Vs (sine) and Vc (cosine), obtained from the signals Vo, V180 and from the signals V90 and V270.

Zero Resetting System

An important accessory component of the transducer is the zero resetting system. In fact the measurement is "incremental" and not "absolute" in that the position in the interior of the step is detectable but it is not possible as priori to determine which is the step concerned.

Downstream of the transducer, accumulators can be arranged that, starting from a certain position maintains a memory of the position reach. Moreover, it is the transducer's task to supply the certain starting position.

The same type of proximity sensor used for the measurement—this time however using a single sensor wire and not a fret-can also be used to obtain a zero mark. To this end a track can be placed, parallel to the scale, which bears an engraving at the zero point, to give the signal.

To facilitate the decision about the direction to take for finding the zero reference, a step can be used rather than a thin engraving. On one side there is the continual presence of metal and on the other the continual absence. Tow complementary tracks are necessary to achieve the differential effect and a precise synchronization with a transversal short circuit of the scale. The geometry of the scale assumes the form in FIG. 19 in which, in black the parts hollowed out without metal are indicated. Element 66 indicates the scale with metal in transversal segments. Elements 68 and 69 indicated the two tracks with solid and void portions. These portions are longitudinal and opposite, and staggered one with respect to the other to define the "zero".

Instead of engraving a single mark on the zero track, codified information can be engraved, always synchronized with the measurement scale, which allows, with a shift of a few steps, the absolute reading of the position.

The coding of solid/void on the zero track is done in an unequivocal way as described below.

The single information bits (obtainable from the presence or not of metal in correspondence with a step of the scale) are grouped in frames each of 'b' bits. An absolute position is codified in 'p' frames, of which the first is synchronism and is recognizable by its sole coding. The first bit of the data frames is always equal to '0', whilst the synchronism frame has all its bits (including the first) equal to '1'. Since every data frame contains "b−1" information bits (the first is not usable because it is always zero) and "p−1" frames available for every group, we have absolute information of (b−1*p−1) bits that is obtainable in b*p steps. The unequivocal range is therefore equal to:

$$b*p*2\ exp((b-1)*(p-1))\ \text{steps}.$$

For example if four frames of four bits are used, 9 bits (512 positions) of information are achieved with 4*4=16 steps. In the case of one step of the zero track coinciding with one step of the scale at its 1 mm, this makes an absolute measurement possible on 16*512=8192 mm of the range: different numbers can be used if the range is insufficient.

If the value 1 (one) is assigned to the presence of metal and 0 to the void, it is possible to have the following codification:

1111 0000 0000 0000 1111 0000 0000 0001 1111 0000 0000 0010 1111 0 . . .

In general in a block of four frames there will be this configuration: 111 0xxx 0xxx 0xxx . . . where x stands for a data (1 or 0) It will be easy for a system of downstream elaboration to recognize the sole synchronism sequence of the 5 bits '11110' and therefore reconstruct the absolute position.

In FIG. 20 the configurations of scale 70 are shown, in black the hollowed out parts without metal, and the cursor 72 complete with codified tracks for zero resetting.

On scale 70 are:
- a track S21 which contains the succession of transversal short circuits at a constant step "p" to be used for the fine measurement;
- a track S11 which contains the codified information relative to the absolute position; the sequence of 1 and 0 is marked corresponding to the information bits;
- a track S31 which contains the codified information complementary to track S11.

On the cursor 72, which is seen from the side facing scale 70, the numbers n1 n2 n3 n4 are integers and indicate the distance of the four frets G11, G22, G33, G44, out of phase by 0, 90, 270, 180 degrees; the two sensors W11 and W22 for the codified tracks are also indicated, made up of a simple length of conductor.

The scales and cursors have until now been represented in linear form. In the case of rotary transducers, the configuration is identical, unless the longitudinal axis like the A—A of the measurement system has a circumferential development.

In the case of a circular transducer there are two practical configurations:
- in the first the scale and the cursor are arranged on a circle and therefore they are face to face;
- in the second the scale is traced onto a cylindrical surface (like the toothing of a straight-tooth gear) whilst the cursor, suitably bulged, is facing laterally.

It is understood that the drawing shows only an example given as a practical demonstration of the invention, since this invention can vary in shape and disposition without however changing the functioning principle.

The presence of reference numbers in the claims enclosed aims to facilitate the reading of the claims with reference to the description and the drawing, and does not limit the scope of protection represented by the claims.

I claim:

1. A measurement transducer comprising:
   a cursor having a single length of sensor wire formed into a substantially straight member in a sensor area, a supply circuit means for generating a magnetic field near and around said sensor wire, said supply circuit being electrically connected to said sensor wire, and said cursor also having detection means for monitoring said magnetic field, and detecting an alteration in said magnetic field due to electrically conductive material intercepting magnetic flux lines of said magnetic field,
   said detection means detecting variations in current flowing through said sensor wire; and
   a scale having a plurality of passive transversal short circuit means for forming an electrical short circuit to intercept and alter said magnetic field, said short circuit means being aligned in a substantially straight formation and spaced at substantially constant steps, an amount of flux of said magnetic field intercepted by said scale being cyclically variable as a function of relative position between said cursor and said scale.

2. An inductive proximity sensor comprising:
   an inductive circuit including a single length of sensor wire forming a sensor area containing non-magnetic cores, and a supply circuit means for generating a magnetic field near and around said sensor wire in said sensor area, said magnetic field extending a sensor distance from said sensor wire, said sensor distance being approximately two or three times a cross section distance of said sensor wire, said supply circuit means also having a step-down transformer with a high ratio between a primary and a secondary winding, said step-down transformer being interposed between a power supply and said sensor wire; and
   detection means electrically connected to said inductive circuit and for monitoring said magnetic field of said sensor wire and detecting an alteration in said magnetic field due to electrically conductive material intercepting magnetic flux lines within said sensor distance.

3. A sensor in accordance with claim 2, wherein said secondary winding of said step-down transformer has only a single turn, and said single turn being a conductor strip tightly wound on said step-down transformer.

4. A measurement transducer comprising:
   a cursor having a single length of sensor wire formed into a substantially straight member in a sensor area, a supply circuit means for generating a magnetic field near and around said sensor wire, said supply circuit being electrically connected to said sensor wire, and said cursor also having detection means for monitoring said magnetic field and detecting an alteration in said magnetic field due to electrically conductive material intercepting magnetic flux lines of said magnetic field; and
   a scale having a plurality of passive transversal short circuit means for forming an electrical short circuit to intercept and alter said magnetic field, said short circuit means being aligned in a substantially straight formation and spaced at substantially constant steps, an amount of flux of said magnetic field intercepted by said scale being cyclically variable as a function of relative position between said cursor and said scale, said scale being formed as an engraved metallic mass with parallel and equidistant bar projections as said short circuit means.

5. A transducer in accordance with claim 4, wherein:
   said sensor wire is formed into a plurality of substantially parallel and substantially straight members connected in a fret-like form in said sensor area, said substantially straight members in said fret-like form being spaced apart by a distance substantially equal to said substantially constant steps.

6. A transducer in accordance with claim 4, further comprising:
   another cursor having a single length of sensor wire formed into a substantially straight member in a sensor area, a supply circuit means for generating a magnetic field near and around said sensor wire of said another cursor, said supply circuit of said another cursor being electrically connected to said sensor wire of said another cursor and said another cursor also having detection means for monitoring said magnetic field of said another cursor and detecting an alteration in said magnetic field of said another cursor due to electrically conductive material intercepting magnetic flux lines of said magnetic field of said another cursor, said another cursor being spaced from said cursor by a distance substantially equal to half of one of said steps; and
   differential means for sensing a difference between said detection means of said cursor and said detection means of said another cursor.

7. A transducer in accordance with claim 4, further comprising:
   another cursor having a single length of sensor wire formed into a substantially straight member in a sensor area, a supply circuit means for generating a magnetic field near and around said sensor wire of said another cursor, said supply circuit of said another cursor being electrically connected to said sensor wire of said another cursor and said another cursor also having detection means for monitoring said magnetic field of said another cursor and detecting an alteration in said magnetic field of said another cursor due to electrically conductive material intercepting magnetic flux lines of said magnetic field of said another cursor, said another cursor being spaced from said cursor by a distance substantially equal to one quarter of one of said steps; and
   differential means for sensing a difference between said detection means of said cursor and said detection means of said another cursor.

8. A transducer in accordance with claim 4, further comprising:
   a first additional cursor spaced from said cursor by a distance substantially equal to one-quarter of one of said steps;
   a second additional cursor spaced from said first additional cursor by a distance substantially equal to one-quarter of one of said steps;
   a third additional cursor spaced from said second additional cursor by a distance substantially equal to one-quarter of one of said steps.

9. A transducer in accordance with claim 4, wherein said scale is made of a grid of said short circuit means.

10. A transducer in accordance with claim 4, wherein said detection means monitors said magnetic field within an area three times a cross sectional distance of said substantially straight member.

11. A transducer in accordance with claim 4, wherein said short circuits are formed as a series of loops of electrically conductive material.

12. A transducer in accordance with claim 11, wherein said loops of said series of loops are formed of a plurality of longitudinal loops also forming electrical short circuits.

13. A transducer in accordance with claim 4, further comprising:
- a zeroing cursor having a single length of sensor wire formed into a substantially straight member in a sensor area; a supply circuit means for generating a magnetic field near and around said sensor wire of said zeroing cursor, said supply circuit of said zeroing cursor being electrically connected to said sensor wire of said zeroing cursor and said zeroing cursor also having detection means for monitoring said magnetic field of said zeroing cursor and detecting an alteration in said magnetic field of said zeroing cursor due to electrically conductive material intercepting magnetic flux lines of said magnetic field of said zeroing cursor; and
- a track substantially parallel to said scale, said track having a portion of electrically conductive means for intercepting and altering said magnetic field of said zeroing cursor, said electrically conductive portion defining a zero point.

14. A transducer in accordance with claim 13, further comprising:
- an additional zeroing cursor having a single length of sensor wire formed into a substantially straight member in a sensor area: a supply circuit means for generating a magnetic field near and around said sensor wire of said additional zeroing cursor, said supply circuit of said additional zeroing cursor being electrically connected to said sensor wire of said additional zeroing cursor and said additional zeroing cursor also having detection means for monitoring said magnetic field of said additional zeroing cursor and detecting an alteration in said magnetic field of said additional zeroing cursor due to electrically conductive material intercepting magnetic flux lines of said magnetic field of said additional zeroing cursor; and
- an additional track substantially parallel to said scale, said additional track having a portion of electrically conductive means for intercepting and altering said magnetic field of said additional zeroing cursor, said electrically conductive portion defining a zero point;
- said portion of electrically conductive material of said additional track being present in areas of said additional track when said portion of said electrically conductive material of said track is not present.

15. A transducer in accordance with claim 14, wherein said track has a plurality of portions of electrically conductive material and absolute position is determined by distance between said plurality of said portions of electrically conductive material.

16. A transducer in accordance with claim 15, wherein said distance between said plurality of portions of electrically conductive material is divided into a plurality of frames, each of said plurality of frames is divided into bits equal to a number of steps in said each frame, and an unequivocal code is assigned to said distance between said plurality of electrically conductive material by interaction between said short circuit means of said scale and said plurality of electrically conductive portions.

* * * * *